(12) United States Patent
Hsiao

(10) Patent No.: US 7,508,894 B2
(45) Date of Patent: Mar. 24, 2009

(54) APPARATUS OF ADJUSTING WOBBLE CLOCK

(75) Inventor: Yuan-Kun Hsiao, Taipei Hsien (TW)

(73) Assignee: Tian Holdings, LLC, Wilmington, DE (US)

( * ) Notice: Subject to any disclaimer, the term of this patent is extended or adjusted under 35 U.S.C. 154(b) by 773 days.

(21) Appl. No.: 10/709,022

(22) Filed: Apr. 7, 2004

(65) Prior Publication Data

US 2005/0018800 A1 Jan. 27, 2005

Related U.S. Application Data

(60) Provisional application No. 60/461,578, filed on Apr. 10, 2003.

(51) Int. Cl.
*H04L 7/00* (2006.01)

(52) U.S. Cl. ............... 375/371; 375/373; 375/374; 375/375; 375/376; 327/25; 327/34; 327/156

(58) Field of Classification Search ......... 375/371, 375/353–354, 362, 373–376, 226, 327; 369/53.2, 369/47.31

See application file for complete search history.

(56) References Cited

U.S. PATENT DOCUMENTS

| | | | |
|---|---|---|---|
| 4,999,824 A | 3/1991 | Fuji et al. | |
| 5,475,666 A | 12/1995 | Ito et al. | |
| 5,689,482 A | 11/1997 | Iida | |
| 5,939,947 A * | 8/1999 | Nakao et al. | ........... 331/11 |
| 6,088,307 A | 7/2000 | Fushimi | |
| 6,285,219 B1 | 9/2001 | Pauls | |
| 6,333,902 B1 | 12/2001 | Shim | |
| 6,345,023 B1 | 2/2002 | Fushimi et al. | |
| 6,587,417 B2 | 7/2003 | Okamoto | |
| 6,661,752 B2 | 12/2003 | Eom | |
| 6,754,147 B2 * | 6/2004 | Hsu et al. | ........... 369/47.28 |
| 6,765,861 B2 | 7/2004 | Van Vlerken | |
| 6,785,207 B2 | 8/2004 | Nishimura et al. | |
| 6,891,785 B2 | 5/2005 | Yamamoto et al. | |
| 6,956,800 B2 | 10/2005 | Tanaka | |
| 7,016,277 B2 | 3/2006 | Chou | |
| 7,046,598 B2 | 5/2006 | Eom | |
| 7,053,919 B2 | 5/2006 | Nagano | |
| 7,176,730 B2 * | 2/2007 | Chang | ........... 327/156 |
| 2002/0027966 A1 * | 3/2002 | Fukuhara | ........... 375/376 |
| 2002/0131347 A1 | 9/2002 | Ranymakers et al. | |
| 2003/0043714 A1 | 3/2003 | Takeda | |
| 2003/0067335 A1 * | 4/2003 | von Kaenel | ........... 327/158 |
| 2003/0081516 A1 * | 5/2003 | Takumai et al. | ........... 369/47.31 |
| 2003/0081531 A1 | 5/2003 | Mashimo et al. | |

(Continued)

FOREIGN PATENT DOCUMENTS

CN 1373474 A 10/2002

(Continued)

*Primary Examiner*—Shuwang Liu
*Assistant Examiner*—Hirdepal Singh
(74) *Attorney, Agent, or Firm*—Perkins Coie LLP

(57) ABSTRACT

An apparatus for adjusting the phase of a wobble clock including a phase adjusting circuit for receiving a wobble signal and a wobble clock to generate a phase adjusting value, and a frequency divider coupled to the phase adjusting circuit for adjusting the phase of the wobble clock according to the phase adjusting value.

24 Claims, 11 Drawing Sheets

U.S. PATENT DOCUMENTS

| | | |
|---|---|---|
| 2003/0179665 A1 | 9/2003 | Iwazawa et al. |
| 2004/0057360 A1* | 3/2004 | Banno .................. 369/47.31 |
| 2004/0141577 A1 | 7/2004 | Brunn |
| 2004/0213119 A1 | 10/2004 | Van Vlerken et al. |
| 2005/0073923 A1 | 4/2005 | Tobita |
| 2007/0242127 A1* | 10/2007 | Omori et al. .............. 347/248 |

FOREIGN PATENT DOCUMENTS

| | | |
|---|---|---|
| JP | 11-353686 | 12/1999 |
| TW | 509927 | 11/2002 |

* cited by examiner

APPARATUS OF ADJUSTING WOBBLE CLOCK

BACKGROUND OF INVENTION

1. Field of the Invention

The present invention relates in general to an optical disc drive, and more particularly, to an optical disc drive capable of adjusting the phase of a wobble clock with a frequency divider.

2. Description of the Prior Art

Over the past few years, storage media have rapidly increased in storage capacity due to demand for storing a tremendous amount of information. Of all the various kinds of storage media, optical discs have features of a low-cost, small-size, low-error-rate, long-storage-time, and high-density storage medium and are the most promising dominant storage medium in the future. Generally speaking, optical disc drives are used to read information stored on an optical disc. Examples of optical disc drives are known as compact disc drives (CD-ROM drives) and digital versatile disc drives (DVD-ROM drives) in the prior art. Some optical disc drives have the additional capability of being able to write data onto an optical disc, i.e., CD-R/RW, DVD+R/RW and DVD-R/RW drivers. Optical disc drives are used in music and video playback and are implemented in recording devices and other electronic devices.

In order to effectively manage the information stored on a digital versatile disc, the data storage region of the digital versatile disc is divided into many frames. Data can be stored in these frames according to a memory format. Therefore, while in a writing process for a rewritable digital versatile disc, the DVD drive has to identify the memory format of the rewritable digital versatile disc before the writing process. In order to record the related information concerning the memory frames, there are special addressing structures on the rewritable digital versatile disc to record the related information. According to the specifications of a recordable or a rewritable digital versatile disc, the related information recorded in the addressing structures is known as the address in pre-groove (ADIP).

It is well-known that the information of the ADIP is recorded in the wobble signal by a phase modulation technique, which means that the information is recorded according to the phase shift of a carrier. Every pair of record areas on an optical disc corresponds to 93 wobble cycles, and 8 wobble cycles of them are utilized to record an ADIP by phase modulation.

Please refer to FIGS. 1-3. FIGS. 1-3 are diagrams of schematic waveforms of the prior art wobble signals $4a$, $4b$, and $4c$. The wobble signal $4a$ shown in FIG. 1 comprises 8 wobble cycles W0, W1, W2, W3, W4, W5, W6, and W7, which are utilized to record the information of an ADIP by phase modulation. As is shown in FIG. 1, a phase shift of 180° occurs at the beginning of the first phase-modulated cycle W0 of the wobble signal $4a$. In addition, a phase shift of 180° also occurs between the wobble cycle W3 and the wobble cycle W4 of the wobble signal $4a$. Consequently, the wobble signal $4a$ corresponds to an ADIP sync unit. Similarly, the wobble signal $4b$ shown in FIG. 2 comprises 8 wobble cycles W0, W1, W2, W3, W4, W5, W6, and W7, which are utilized to record the information of an ADIP by phase modulation. As is shown in FIG. 2, a phase shift of 180° occurs at the beginning of the first phase-modulated cycle W0 of the wobble signal $4b$. In addition, a phase shift of 180° also occurs between the wobble cycle W0 and the wobble cycle W1 of the wobble signal $4b$, and a phase shift of 180° further occurs between the wobble cycle W5 and the wobble cycle W6 of the wobble signal $4b$. Consequently, the wobble signal $4b$ corresponds to an ADIP data unit having a corresponding logic level of 0. Likewise, the wobble signal $4c$ shown in FIG. 3 comprises 8 wobble cycles W0, W1, W2, W3, W4, W5, W6, and W7, which are utilized to record the information of an ADIP by phase modulation. As is shown in FIG. 3, a phase shift of 180° occurs at the beginning of the first phase-modulated cycle W0 of the wobble signal $4c$. In addition, a phase shift of 180° also occurs between the wobble cycle W3 and the wobble cycle W4 of the wobble signal $4c$, and a phase shift of 180° further occurs between the wobble cycle W5 and the wobble cycle W6 of the wobble signal $4c$. Consequently, the wobble signal $4c$ corresponds to an ADIP data unit having a corresponding logic level of 1.

As is described above, the information of an ADIP unit is recorded in the wobble signal by phase modulation, therefore the optical disc drive is required to utilize an ADIP decoder to decode the information of an ADIP unit. Please refer to FIG. 4 in conjunction with FIG. 5. FIG. 4 shows a functional block diagram of a prior art optical disc drive system 10. FIG. 5 is a diagram of schematic waveforms of the wobble signals WBL, WBL', and WBL'', and the wobble clock CLK, which are actually the operating clock waveforms related to the optical disc drive system 10 in FIG. 4 with time along the abscissa. The optical disc drive system 10 comprises an optical disc 12 and an optical disc drive 14. The optical disc drive 14 comprises an optical pickup 15, a first band-pass filter 16, a second band-pass filter 18, a wobble clock generator 20, a frequency divider 21, an ADIP decoder 22, and a controller 24.

As is well known in the specifications of a DVD+R disc drive or a DVD+RW disc drive, on the reflecting surface of the optical disc 12, there is a fine spiral track. The fine track is composed of two types of tracks, one being a data track to record data having a value of 0 or 1, and the other being a wobble track to record related addressing information. The data track has an interrupt and discontinuity record mark, and the wobble track has an oscillating shape. The surface of the wobble track protrudes beyond the reflecting surface of the optical disc 12. The data track is located inside a groove formed by the raised wobble track. The length of each record mark varies, and the reflection characteristic of the record mark is different from that of the other reflecting surface of the optical disc.

Consequently, the ADIP is recorded in the wobble track to assist the process of reading or writing data on the data track by the optical pickup 15. Thereby, the optical pickup 15 is able to extract the tracking information carried by the wobble track of the optical disc 12 and generates a wobble signal WBL. The wobble signal WBL is then forwarded to the first band-pass filter 16. The wobble signal WBL' generated by the first band-pass filter 16 based on the wobble signal WBL is forwarded to both the second band-pass filter 18 and the ADIP decoder 22.

Traditionally, the first band-pass filter 16 is a band-pass filter having a low quality factor (Q-factor), and the second band-pass filter 18 is a band-pass filter having a high quality factor. Because of the first band-pass filter 16 having a low quality factor, the wobble signal WBL' generated by the first band-pass filter 16 based on the wobble signal WBL has the component having a frequency outside the predetermined dominant band suffer from a slight decay as is shown in FIG. 5. On the contrary, because of the second band-pass filter 18 having a high quality factor, the wobble signal WBL'' generated by the second band-pass filter 18 based on the wobble signal WBL' has the component having a frequency outside the predetermined dominant band suffer from a significant decay as is shown in FIG. 5.

The wobble signal WBL" is then forwarded to the wobble clock generator 20. The wobble clock generator 20 is utilized to generate a reference clock CLK_REF based on the wobble signal WBL". Traditionally, the frequency of the reference clock CLK_REF is higher than the frequency of the wobble signal WBL". For instance, the frequency of the reference clock CLK_REF is 32 times as high as the frequency of the wobble signal WBL". Accordingly, the frequency divider 21 is required to lower the frequency of the reference clock CLK_REF and generate the wobble clock CLK, for instance the frequency of the wobble clock CLK is ⅓₂ as high as the frequency of the reference clock CLK_REF. Thereafter, the ADIP decoder 22 is able to decode the ADIP of the wobble signal WBL based on the wobble clock CLK and the wobble signal WBL'. For instance, with the aid of the frequency divider 21, the non-phase-modulated wobble clock CLK is generated through the wobble clock generator 20 based on the phase-modulated wobble signal WBL". Next, the ADIP decoder 22 performs an XOR logic operation over the wobble clock CLK and the wobble signal WBL' to extract the ADIP of the phase-modulated wobble signal WBL. The ADIP generated is then forwarded to the controller 24. Thereafter, the controller 24 is able to perform a reading or writing process on the optical disc 12 based on the ADIP.

As aforementioned, the wobble signal WBL' is generated by the first band-pass filter 16 having a low quality factor based on the wobble signal WBL. Subsequently, the wobble signal WBL" is generated by the second band-pass filter 18 having a high quality factor based on the wobble signal WBL'. Afterward, the reference clock CLK_REF is generated by the wobble clock generator 20 based on the wobble signal WBL". Then, the wobble clock CLK is generated by the frequency divider 21 based on the reference clock CLK_REF. Consequently, a phase delay occurs between the wobble signal WBL' and the wobble signal WBL", and the amount of the phase delay depends on the first band-pass filter 16 and the second band-pass filter 18. Therefore, as the ADIP decoder 22 generates the ADIP by decoding the wobble signal WBL' with the aid of the wobble clock CLK, the phase delay may cause an error operation of the XOR decoding process.

Please refer to FIG. 6. FIG. 6 is a diagram of schematic waveforms of the wobble signal WBL', the ideal wobble clock CLK, the real wobble clock CLK', the ideal processing signal S1, and the real processing signal S2, which are the operating clock waveforms related to the ADIP decoder 22 in FIG. 4 with time along the abscissa. For the sake of clarity, the effects of the first band-pass filter 16 and the noise interference are not under consideration, and the ideal waveform of the wobble signal WBL' is shown in the first waveform of FIG. 6. Then, if the phase delay caused by the second band-pass filter 18 is not under consideration, the ideal waveform of the wobble clock CLK is shown in the second waveform of FIG. 6. However, if the phase delay caused by the second band-pass filter 18 is under consideration, the real waveform of the wobble clock CLK' is shown in the third waveform of FIG. 6. Obviously, there is a phase difference between the real wobble clock CLK' and the ideal wobble clock CLK. In other words, the phase of the real wobble clock CLK' lags the phase of the ideal wobble clock CLK. For instance, as is shown in FIG. 6, the phase difference the real wobble clock CLK' and the ideal wobble clock CLK is 90°. After the ADIP decoder 22 performs an XOR operation over the wobble signal WBL' and the wobble clock, two possible resultant waveforms are shown in FIG. 6. The fourth waveform of FIG. 6 shows the resultant waveform of the ideal processing signal S1 by an XOR operation over the wobble signal WBL' and the ideal wobble clock CLK. The fifth waveform of FIG. 6 shows the resultant waveform of the real processing signal S2 by an XOR operation over the wobble signal WBL' and the real wobble clock CLK'. Obviously, if the ADIP decoder 22 generates the ADIP by decoding the wobble signal WBL' with the aid of the real wobble clock CLK', the phase delay may cause an error operation of the XOR decoding process as is shown in FIG. 6.

SUMMARY OF INVENTION

It is therefore a primary objective of the claimed invention to provide an optical disc drive capable of adjusting the phase of a wobble clock with a frequency divider to solve the above-mentioned problem of the prior art optical disc drive.

According to a preferred embodiment of the claimed invention, the apparatus capable of adjusting the phase of a wobble clock comprises a phase adjusting circuit for receiving a wobble signal and a wobble clock to generate a phase adjusting value, and a frequency divider connected to the phase adjusting circuit for adjusting the phase of the wobble clock by performing a dividing process on a reference clock according to the phase adjusting value.

According to a preferred embodiment of the claimed invention, the method of adjusting the phase of a wobble clock comprises generating a phase adjusting value based on a wobble signal and a wobble clock, and adjusting the phase of the wobble clock by performing a dividing process on a reference clock according to the adjusting value.

According to the preferred embodiment of the claimed invention, a phase adjusting circuit is utilized to calculate the phase difference between the wobble signal and the wobble clock. Furthermore, the phase adjusting circuit generates a phase adjusting value according to the phase difference. The phase adjusting value is then forwarded to the frequency divider. When the phase of the wobble signal leads the phase of the wobble clock, the phase adjusting circuit will decrease the phase adjusting value to advance the phase of the wobble clock, which causes the phase difference to reduce. When the phase of the wobble signal lags the phase of the wobble clock, the phase adjusting circuit will increase the phase adjusting value to delay the phase of the wobble clock, which causes the phase difference to reduce.

These and other objectives of the claimed invention will no doubt become obvious to those of ordinary skill in the art after reading the following detailed description of the preferred embodiment that is illustrated in the various figures and drawings.

DETAILED DESCRIPTION

Figure 7:
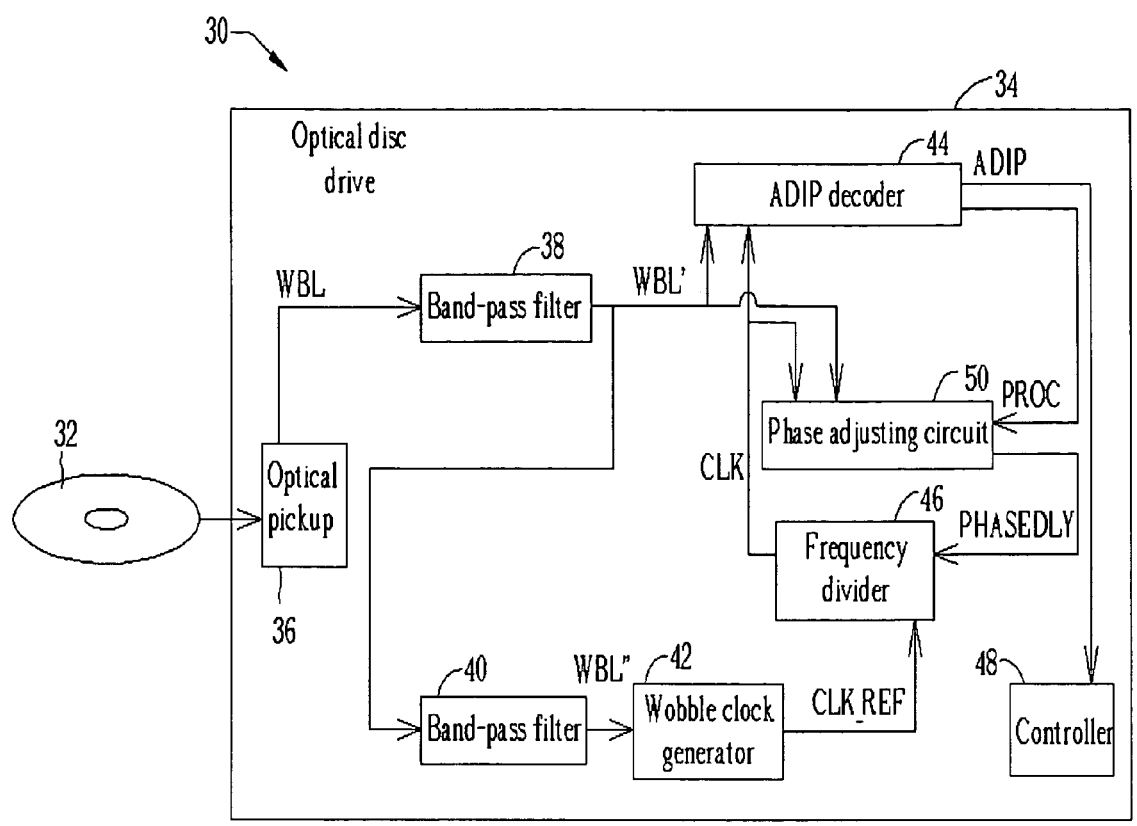
FIG. 7 shows a functional block diagram of an optical disc drive system according to the claimed invention.

Please refer to FIG. 7. FIG. 7 shows a functional block diagram of an optical disc drive system 30 according to one preferred embodiment of the claimed invention. The optical disc drive system 30 comprises an optical disc 32 and an optical disc drive 34. The optical disc drive 34 comprises an optical pickup 36, a first band-pass filter 38, a second band-pass filter 40, a wobble clock generator 40, an ADIP decoder 42, a frequency divider 46, a controller 48, and a phase adjusting circuit 50. Please note that although the frequency divider 46 and the phase adjusting circuit 50 are external to the wobble clock generator 42 in the preferred embodiment, this should not be taken as a limitation. For instance, the frequency divider 46 and the phase adjusting circuit 50 can be integrated into the wobble clock generator 42 according to another preferred embodiment of the claimed invention.

Figure 8:
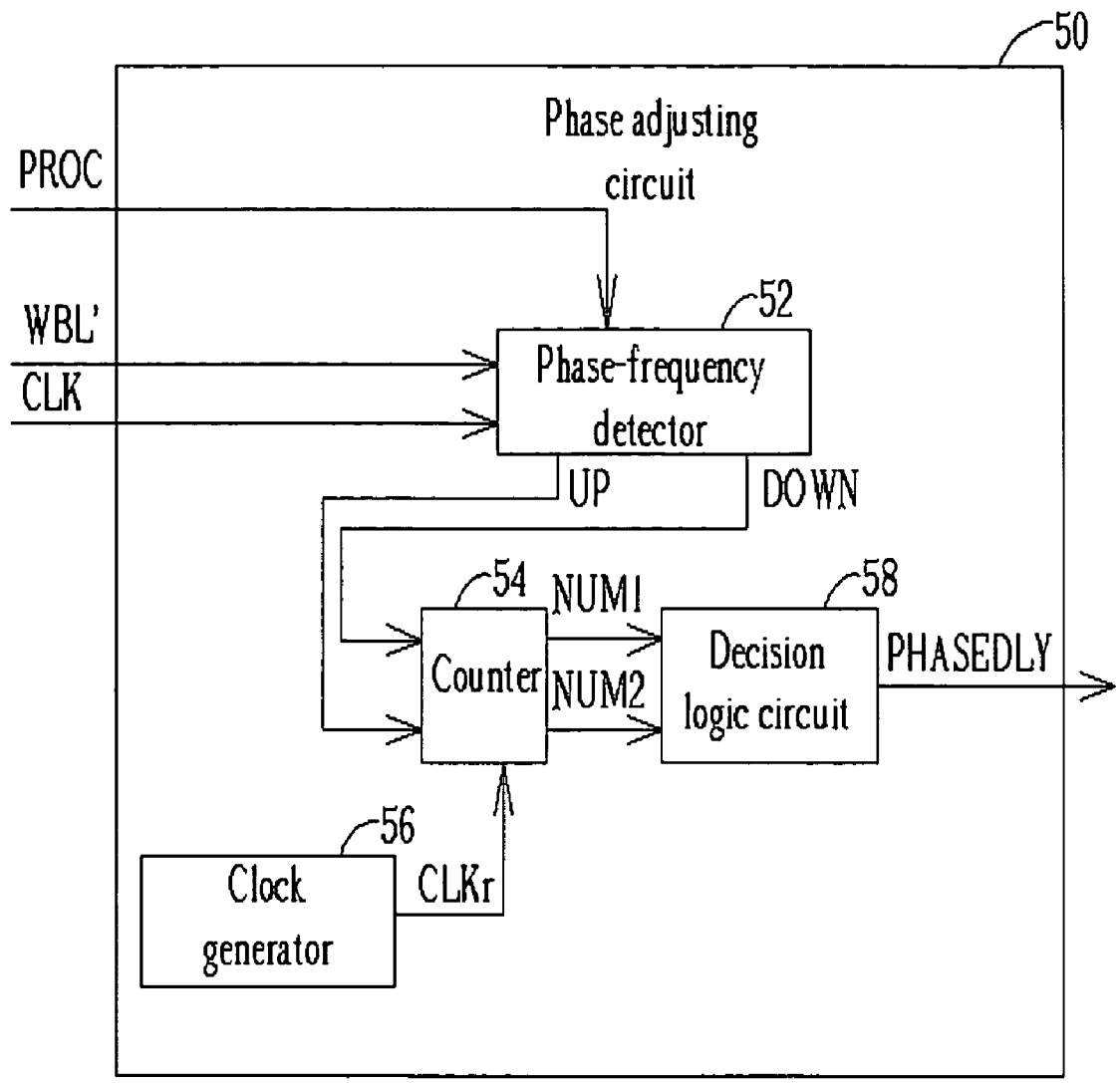
FIG. 8 shows a functional block diagram of the phase adjusting circuit in FIG. 7.

According to the preferred embodiment, the phase adjusting circuit 50 of the optical disc drive 34 is utilized to generate a phase adjusting value PHASEDLY to adjust the phase of the wobble clock generated by the frequency divider 46. Please refer to FIG. 8. FIG. 8 shows a functional block diagram of the phase adjusting circuit in FIG. 7. The phase adjusting circuit 50 comprises a phase-frequency detector (PFD) 52, a counter 54, a clock generator 56, and a decision logic circuit 58. The phase-frequency detector 52 is utilized to compare the phase relationship between the wobble signal WBL' and the wobble clock CLK and generate two corresponding control signals UP and DOWN. For instance, when the wobble signal WBL' switches from a logic level of 0 to a logic level of 1, the phase-frequency detector 52 is triggered to output the control signal UP, which means a rising edge of the wobble signal WBL' is able to trigger the control signal UP. When the wobble clock CLK switches from a logic level of 0 to a logic level of 1, the phase-frequency detector 52 is triggered to output the control signal DOWN, which means a rising edge of the wobble clock CLK is able to trigger the control signal DOWN. For instance, if a rising edge of the wobble signal WBL' occurs at a time T, the phase-frequency detector 52 is triggered to output the control signal UP. Thereafter, if a rising edge of the wobble clock CLK occurs at a time T+dT, the phase-frequency detector 52 is triggered to output an impulse of the control signal DOWN. Next, the phase-frequency detector 52 will reset the control signals UP and DOWN concurrently. Similarly, if a rising edge of the wobble clock CLK occurs at a time T, the phase-frequency detector 52 is triggered to output the control signal DOWN. Thereafter, if a rising edge of the wobble signal WBL' occurs at a time T+dT, the phase-frequency detector 52 is triggered to output an impulse of the control signal UP. Next, the phase-frequency detector 52 will reset the control signals UP and DOWN concurrently.

The clock generator 56 is utilized to generate a reference clock CLKr and forwards the reference clock CLKr to the counter 54. The counter 54 generates the counting values NUM1 and NUM2 by counting the numbers of cycles of the reference clock CLKr during the corresponding durations of the control signals UP and DOWN. For instance, if the frequency of the reference clock CLKr is Fr and the duration of the triggered control signal UP is Tp1, the corresponding counting value NUM1 is Fr*Tp1. In the same way, if the frequency of the reference clock CLKr is Fr and the duration of the triggered control signal DOWN is Tp2, the corresponding counting value NUM2 is Fr*Tp2. The decision logic circuit 58 calculates a sum based on the counting values NUM1 and NUM2 and determines whether the phase adjusting value PHASEDLY is output to drive the frequency divider 46 to adjust the phase of the wobble clock CLK.

According to the preferred embodiment, the counting value NUM1 is utilized to increase the total sum and the counting value NUM2 is utilized to decrease the sum. For instance, the frequency of the reference clock CLKr generated by the clock generator 56 is 400 times as high as the frequency of the reference clock CLK_REF generated by the wobble clock generator 42, which means one cycle of the reference clock CLK_REF corresponds to 400 cycles of the reference clock CLKr. In other words, the counting value of one cycle of the reference clock CLK_REF based on the reference clock CLKr is 400. Therefore, when a counting value generated by the counter 54 for the duration corresponding to the phase difference of the wobble clock CLK and wobble signal WBL' is 200, the current phase difference then corresponds to a half cycle of the reference clock CLK_REF.

Since the wobble clock WBL' is generated by the first band-pass filter 38 having a low quality factor, the jitter of the wobble clock WBL' is relatively significant, which means the cycle of the wobble clock WBL' is not quit stable. However, the long-term average of cycles of the wobble clock WBL' is quite stable. As aforementioned, when the phase of the wobble signal WBL' leads the phase of the wobble clock CLK, the counting value NUM1 corresponds to the control signal UP, which means the amount of the phase difference between the wobble signal WBL' and the wobble clock CLK is represented by the counting value NUM1. On the contrary, when the phase of the wobble signal WBL' lags the phase of the wobble clock CLK, the counting value NUM2 corresponds to the control signal DOWN, which means the amount of the phase difference between the wobble signal WBL' and the wobble clock CLK is represented by the counting value NUM2. Under ideal situations, the difference of the sum of the counting values NUM1 and the sum of the counting values NUM2 during a plurality of cycles of the wobble signal WBL' is approximately equal to 0. Furthermore, since the phase of wobble signal WBL" generated by the second band-pass filter 40 is also affected by the second band-pass filter 40. Therefore, according to the preferred embodiment, the decision logic circuit 58 determines whether a phase adjusting value PHASEDLY is generated to drive the frequency divider 46 to correct the phase of the wobble clock CLK based on the difference of the sum of the counting value NUM1 and the sum of the counting value NUM1.

Figure 9:
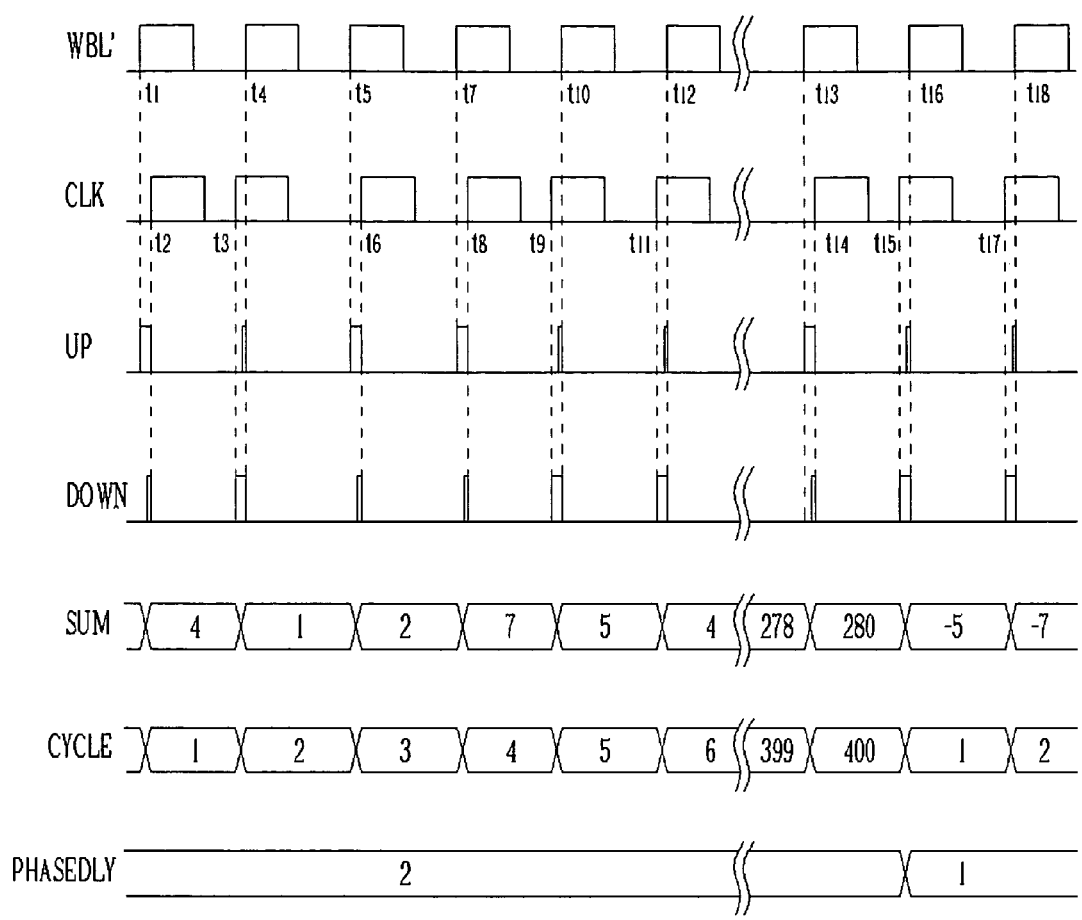
FIG. 9 is a diagram of schematic waveforms of the related signals for the operation of the phase adjusting circuit.

The functional operation of the phase adjusting value PHASEDLY generated by the decision logic circuit 58 is detailed hereafter. Please refer to FIG. 9 in conjunction with FIG. 8. FIG. 9 is a diagram of schematic waveforms of the related signals for the operation of the phase adjusting circuit 50. The schematic waveform from top to bottom corresponds to the wobble signal WBL', the wobble clock CLK, the control signal UP, the control signal DOWN, the total sum SUM calculated by the decision logic circuit 58 based on the control signals UP and DOWN, the total number CYCLE generated by counting the number of the sums SUM generated by the decision logic circuit 58, and the phase adjusting value PHASEDLY.

For instance, the frequency of the reference clock CLKr generated by the clock generator 56 is 400 times as high as the frequency of the reference clock CLK_REF generated by the wobble clock generator 42, and the phase-frequency detector 52 generates the control signals UP and DOWN according to the rising edges of the wobble signal WBL' and the wobble clock CLK respectively. Therefore, at a time t1 shown in FIG. 9, the rising edge of the wobble signal WBL' drives the phase-frequency detector 52 to generate a control signal UP. At a time t2 shown in FIG. 9, the rising edge of the wobble clock CLK drives the phase-frequency detector 52 to generate a control signal DOWN. After the phase-frequency detector 52 generates an impulse of the control signal DOWN, the phase-frequency detector 52 resets both the control signals UP and DOWN. Then, a counting value NUM1 of 4 is generated by the counter 54 through counting the number of cycles of the reference clock CLKr during the duration of the control signal UP between the times t1 and t2. The decision logic circuit 58 then calculates a sum SUM of 4 and the total number CYCLE of the sums SUM generated is 1. The time duration of the impulse of the control signal DOWN occurs at a time t2 is so short that the current related counting value NUM2 can be neglected. Thereafter, at a time t3 shown in FIG. 9, the rising edge of the wobble clock CLK drives the phase-frequency detector 52 to generate a control signal DOWN. At a time t4 shown in FIG. 9, the rising edge of the wobble clock CLK drives the phase-frequency detector 52 to generate a control signal UP. After the phase-frequency detector 52 generates an impulse of the control signal UP, the phase-frequency detector 52 resets both the control signals UP and DOWN. Then, a counting value NUM2 of 3 is generated by the counter 54 through counting the number of cycles of the reference clock CLKr during the duration of the control signal DOWN between the times t3 and t4. The decision logic circuit 58 then calculates a sum SUM of 1, i.e. 4 minus 3, and the total number CYCLE of the sums SUM generated is 2. The time duration of the impulse of the control signal UP occurs at a time t4 is so short that the current related counting value NUM1 can be neglected. Similarly, at a time t5 shown in FIG. 9, the rising edge of the wobble signal WBL' drives the phase-frequency detector 52 to generate a control signal UP. At a time t6 shown in FIG. 9, the rising edge of the wobble clock CLK drives the phase-frequency detector 52 to generate a control signal DOWN. After the phase-frequency detector 52 generates an impulse of the control signal DOWN, the phase-frequency detector 52 resets both the control signals UP and DOWN. Then, a counting value NUM1 of 1 is generated by the counter 54 through counting the number of cycles of the reference clock CLKr during the duration of the control signal UP between the times t5 and t6. The decision logic circuit 58 then calculates a sum SUM of 2, i.e. 1 plus 1, and the total number CYCLE of the sums SUM generated is 3. The time duration of the impulse of the control signal DOWN occurs at a time t6 is so short that the current related counting value NUM2 can be neglected. Thereafter, at a time t7 shown in FIG. 9, the rising edge of the wobble signal WBL' drives the phase-frequency detector 52 to generate a control signal UP. At a time t8 shown in FIG. 9, the rising edge of the wobble clock CLK drives the phase-frequency detector 52 to generate a control signal DOWN. After the phase-frequency detector 52 generates an impulse of the control signal DOWN, the phase-frequency detector 52 resets both the control signals UP and DOWN. Then, a counting value NUM1 of 5 is generated by the counter 54 through counting the number of cycles of the reference clock CLKr during the duration of the control signal UP between the times t7 and t8. The decision logic circuit 58 then calculates a sum SUM of 7, i.e. 2 plus 5, and the total number CYCLE of the sums SUM generated is 4. The time duration of the impulse of the control signal DOWN occurs at a time t8 is so short that the current related counting value NUM2 can be neglected. The above-mentioned procedure proceeds thereafter as is shown in FIG. 9.

According to the preferred embodiment, the decision logic circuit 58 determines whether a phase adjusting value PHASEDLY is generated to drive the frequency divider 46 to correct the phase of the wobble clock CLK based on the result of the phase comparison between the wobble signal WBL' and the wobble clock CLK in a predetermined number of cycles, which is 400 in the current example.

For instance, there are 400 calculations needed for calculating the sum SUM with the decision logic circuit 58 at the time t14. As aforementioned, the duration of the phase difference of the wobble signal WBL' and the wobble clock CLK is evaluated by counting the corresponding number of cycles of the reference clock CLKr through the counter 54. In other words, if a counting value generated by the counter 54 for the duration corresponding to the phase difference of the wobble clock CLK and wobble signal WBL' is 200, the current phase difference then corresponds to a half cycle of the reference clock CLK_REF.

Therefore, if the sum SUM falls into the range between −200 and +200 at the time t14, the corresponding phase difference of the wobble signal WBL' and the wobble clock CLK is less than a half cycle of the reference clock CLK_REF. Under such circumstance, the decision logic circuit 58 is not going to drive the frequency divider 46 to advance or delay a cycle of the reference clock CLK_REF to output the wobble clock CLK, which means the phase of the wobble clock CLK is held unchanged. That is to say, if the wobble signal WBL' leads the wobble clock CLK by a quarter of a cycle of the reference clock CLK_REF and the decision logic circuit 58 drives the frequency divider 46 to advance the phase of the wobble clock CLK by a cycle of the reference clock CLK_REF, then the phase of the wobble signal WBL' turns out to lag the phase of the wobble clock CLK by three quarters of a cycle of the reference clock CLK_REF, which means the phase difference between the wobble signal WBL' and the wobble clock CLK becomes larger. Consequently, only when the phase difference between the wobble signal WBL' and the wobble clock CLK is less than a half cycle of the reference clock CLK_REF, will the decision logic circuit 58 drive the frequency divider 46 to advance or delay the phase of the wobble clock CLK by a cycle of the reference clock CLK_REF for reducing the phase difference between the wobble signal WBL' and the wobble clock CLK.

As is shown in FIG. 9, a sum SUM of 280 is generated by performing 400 calculations for calculating the sum SUM with the decision logic circuit 58 at the time t14. The sum SUM of 280 is larger than 200, which means that the total duration of the control signal UP is longer than the total duration of the control signal DOWN between the times t1 and t14. In other words, the phase of the wobble clock CLK lags the phase of the wobble signal WBL' in long term average, and the corresponding duration of the phase difference is larger than a half cycle of the reference clock CLK_REF. Therefore, the decision logic circuit 58 drives the frequency divider 46 to advance the phase of the wobble clock CLK by a cycle of the reference clock CLK_REF. Thereafter, the phase difference between the wobble signal WBL' and the wobble clock CLK is reduced to be less than a half cycle of the reference clock CLK_REF. On the contrary, if the value of the sum SUM is less than −200 at the time t14, then the total duration of the control signal UP is shorter than the total duration of the control signal DOWN between the times t1 and t14. In other words, the phase of the wobble clock CLK leads the phase of the wobble signal WBL' in long term average, and the corresponding duration of the phase difference is larger than a half cycle of the reference clock CLK_REF. Therefore, the decision logic circuit 58 drives the frequency divider 46 to delay the phase of the wobble clock CLK by a cycle of the reference clock CLK_REF. Thereafter, the phase difference between the wobble signal WBL' and the wobble clock CLK is reduced to be less than a half cycle of the reference clock CLK_REF.

According to the preferred embodiment, the decision logic circuit 58 generates a phase adjusting value PHASEDLY and forwards the phase adjusting value PHASEDLY to the frequency divider 46 to adjust the phase of the wobble clock CLK. After performing a predetermined number of counting calculations needed for calculating the sum SUM with the decision logic circuit 58, the decision logic circuit 58 is going to adjust the phase adjusting value PHASEDLY according to the value of the sum SUM. For instance, if the frequency of the reference clock CLKr is N times as high as the frequency of the reference clock CLK_REF and the sum SUM falls into the range between −0.5*N and +0.5*N, then the decision logic circuit 58 holds the phase adjusting value PHASEDLY, which means the phase of the wobble clock should be held unchanged. If the sum SUM is larger than +0.5*N, then the decision logic circuit 58 decreases the phase adjusting value PHASEDLY by 1, which means the phase of the wobble clock should be delayed. If the sum SUM is less than −0.5*N, then the decision logic circuit 58 increases the phase adjusting value PHASEDLY by 1, which means the phase of the wobble clock should be advanced. Thereafter, the frequency divider 46 adjusts the phase of the wobble clock CLK according to the phase adjusting value PHASEDLY. The operation of the frequency divider 46 is detailed hereafter.

Figure 10:
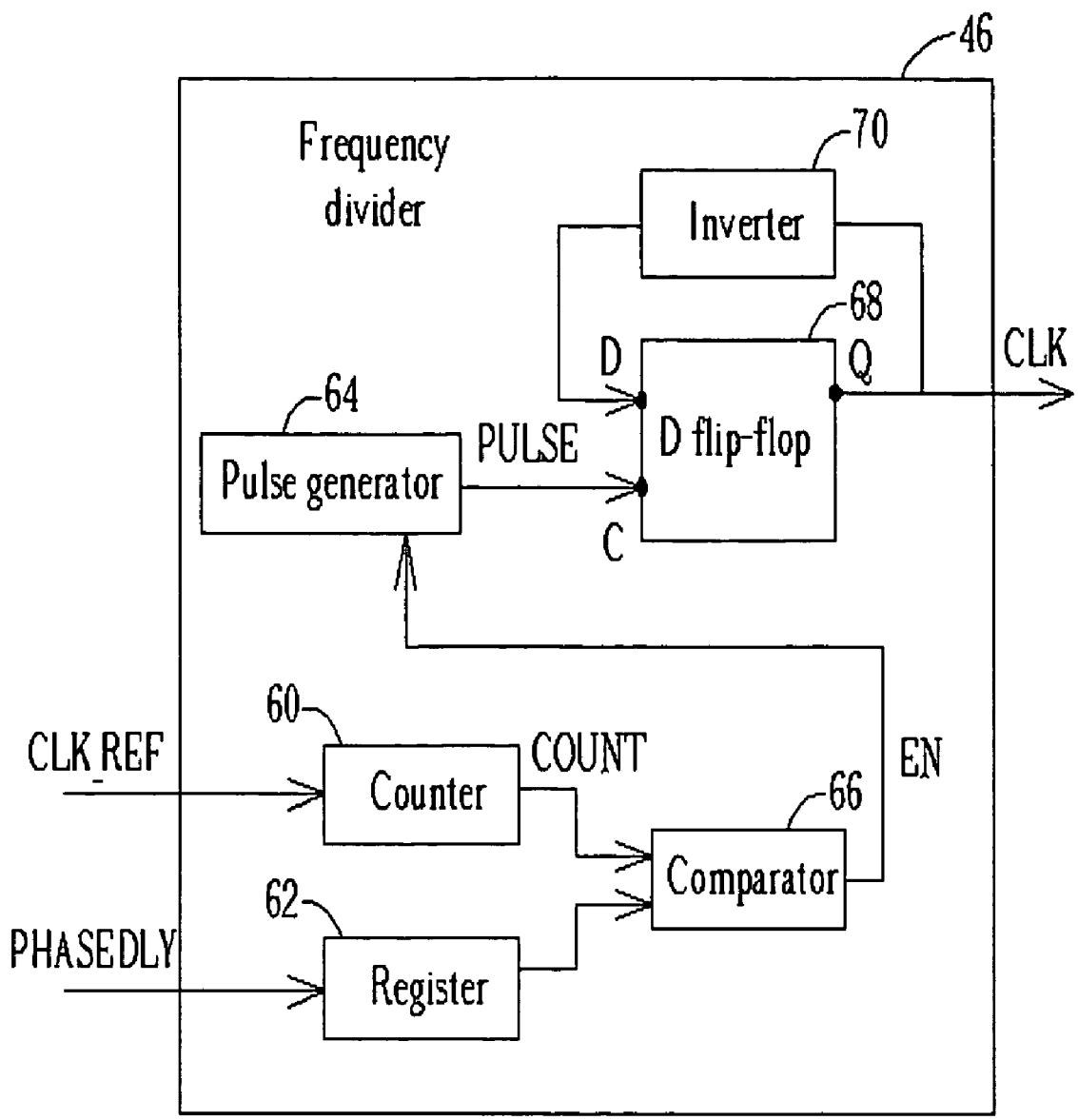
FIG. 10 shows a functional block diagram of the frequency divider in FIG. 7.

Please refer to FIG. 10. FIG. 10 shows a functional block diagram of the frequency divider 46 in FIG. 7. The frequency divider 46 comprises a counter 60, a register 62, a pulse generator 64, a comparator 66, a D flip-flop 68, and an inverter 70. A counting value COUNT is generated by the counter 60 based on the reference clock CLK_REF and is forwarded to the comparator 66. For instance, the rising or falling edge of each cycle of the reference clock CLK_REF is able to trigger the counter 60 to increase the counting value COUNT. Furthermore, as the counting value COUNT is added to a predetermined critical value, the counter 60 will reset the counting value COUNT to an initial value, and the counting value COUNT accumulates again. According to the preferred embodiment, if the frequency divider 46 generates a wobble clock having a frequency equal to 1/(2n) of the frequency of the reference clock CLK_REF, then the counter 60 will reset the counting value COUNT to an initial value when there are n times of accumulating operation performed by the counter 60.

The register 62 is utilized to store the phase adjusting value PHASEDLY and forwards the phase adjusting value PHASEDLY to the comparator 66. The comparator 66 compares the counting value with the phase adjusting value PHASEDLY and determines whether the counting value is equal to the phase adjusting value PHASEDLY. If the counting value is equal to the phase adjusting value PHASEDLY, the comparator 66 will output an enable signal EN to drive the pulse generator 64 to generate an impulse PULSE. The impulse PULSE is then input to the input terminal C of the D flip-flop 68. The D flip-flop 68 can be triggered by a rising or falling edge of the input signal. If the D flip-flop 68 is triggered by a rising edge of the input signal, then the D flip-flop 68 will transfer the data at the input terminal D to the data output terminal Q at the rising edge of the impulse PULSE. Similarly, if the D flip-flop 68 is triggered by a falling edge of the input signal, then the D flip-flop 68 will transfer the data at the input terminal D to the data output terminal Q at the falling edge of the impulse PULSE. Furthermore, the output data at the output terminal Q is fed back to the input terminal D through an inverter 70. In other words, the logic level of the data at the output terminal Q is different from the logic level of the data at the input terminal D. For instance, if the data at the input terminal D holds a logic level of 1, then the data at the output terminal Q holds a logic level of 0. When the D flip-flop 68 is triggered by an input impulse PULSE, the logic level of the data at the output terminal Q becomes 1, and the logic level of the data at the input terminal D becomes 0 due to the operation of the inverter 70. Similarly, When the D flip-flop 68 is triggered by another input impulse PULSE, the logic level of the data at the output terminal Q becomes 0, and the logic level of the data at the input terminal D becomes 1 due to the operation of the inverter 70. Based on the above description, the logic level of the data at the output terminal Q swaps when the D flip-flop 68 is triggered by an input impulse PULSE generated by the pulse generator 64. The data at the output terminal Q of the D flip-flop 68 is actually the wobble clock CLK.

Figure 11:
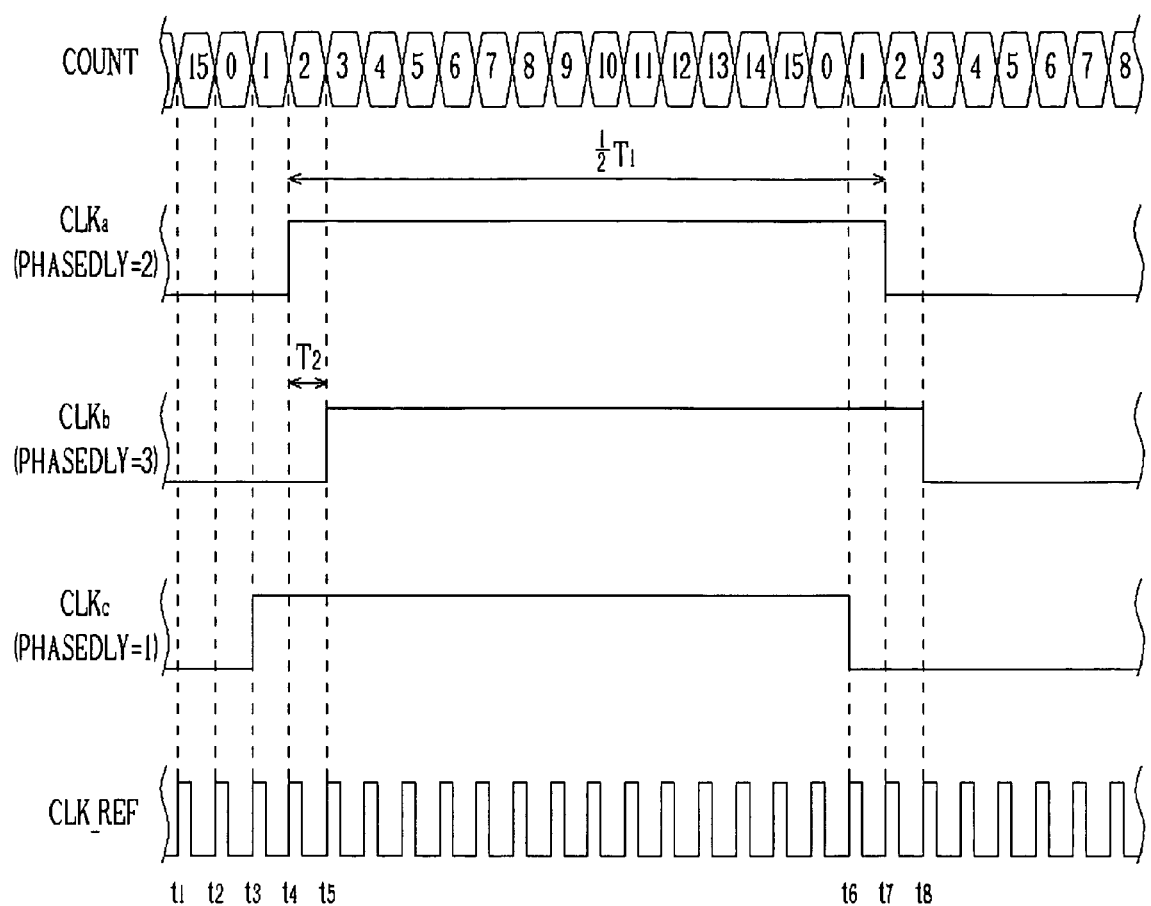
FIG. 11 is a diagram of schematic waveforms of the related signals for the operation of the frequency divider.

Please refer to FIG. 11. FIG. 11 is a diagram of schematic waveforms of the related signals for the operation of the frequency divider 46 in FIG. 10. For the sake of clarity, the frequency of the wobble clock CLK generated by the frequency divider 46 is assumed to be 1/32 of the frequency of the reference clock CLK_REF, the counter 60 is assumed to be triggered by the rising edge of the reference clock CLK_REF, and the initial value of the counter 60 is preset to be 0. Consequently, as the counter 60 accumulates the counting value COUNT from the initial value, the counter 60 resets the counting value COUNT after 16 times of accumulating operation as is shown in FIG. 11. For instance, after the rising edge of the reference clock CLK_REF at a time t1 in FIG. 11, the counting value COUNT generated by the counter 60 becomes 15, which means there are 15 times of accumulating operation performed by the counter 60 after a preceded initial value of 0. Consequently, after the rising edge of the reference clock CLK_REF at a time t2 in FIG. 11, the counter 60 will reset the counting value COUNT to be the initial value of 0, and the counting value COUNT starts another counting process based on the rising edge of the reference clock CLK_REF from the initial value. As aforementioned, when the counting value COUNT is equal to the phase adjusting value PHASEDLY, the comparator 66 will output an enable signal EN to drive the pulse generator 64 to generate an impulse PULSE. The impulse PULSE is then input to the input terminal C of the D flip-flop 68. The D flip-flop 68 is then triggered by the rising edge of the impulse PULSE and switches the logic level of the data at the output terminal Q. For example, if the phase adjusting value PHASEDLY is 2, then the logic level of the data at the output terminal Q switches when the counting value COUNT is equal to 2 at a time t4 or t7, which causes a wobble clock CLKa as is shown in FIG. 11. Similarly, if the phase adjusting value PHASEDLY is 3, then the logic level of the data at the output terminal Q switches when the counting value COUNT is equal to 3 at a time t5 or t8, which causes a wobble clock CLKb as is shown in FIG. 11. Likewise, if the phase adjusting value PHASEDLY is 1, then the logic level of the data at the output terminal Q switches when the counting value COUNT is equal to 1 at a time t3 or t6, which causes a wobble clock CLKc as is shown in FIG. 11.

Obviously, durations of a half cycle of the wobble clocks CLKa, CLKb, and CLKc are all the same, which equal 0.5*T1, and equal the duration of 16 cycles of the reference clock CLK_REF, which equals 16*T2. In other words, the frequencies of the wobble clocks CLKa, CLKb, and CLKc are all the same and equal 1/32 of the frequency of the reference clock CLK_REF. However, because the phase adjusting values PHASEDLY of the wobble clocks CLKa, CLKb, and CLKc are all different, the corresponding phase differences of the wobble clocks CLKa, CLKb, and CLKc are also different. For instance, since the phase adjusting value PHASEDLY of the wobble clocks CLKa is smaller than the phase adjusting value PHASEDLY of the wobble clocks CLKb by a value of 1, the corresponding phase of the wobble clocks CLKa leads the corresponding phase of the wobble clocks CLKb by a duration of a cycle T2 of the reference clock CLK_REF. Similarly, since the phase adjusting value PHASEDLY of the wobble clocks CLKa is larger than the phase adjusting value PHASEDLY of the wobble clocks CLKc by a value of 1, the corresponding phase of the wobble clocks CLKa lags the corresponding phase of the wobble clocks CLKc by a duration of a cycle T2 of the reference clock CLK_REF. Therefore, according to the preferred embodiment, the phase of the wobble clock CLK cab be corrected with the aid of the phase adjusting value PHASEDLY.

As aforementioned, the counter 60 generates counting values COUNT based on the reference clock CLK_REF, and the D flip-flop 68 swaps the logic level of the wobble clock CLK when the counting value COUNT equals the phase adjusting value PHASEDLY. The counting value COUNT generated is recycled within the range of a predetermined value. The predetermined value is actually utilized to define a frequency ratio of the frequency of the reference clock CLK_REF to the frequency of the wobble clock CLK. The phase adjusting value PHASEDLY is utilized to correct the phase of the wobble clock CLK. Therefore, any circuit system having functional operations described above can be integrated into the optical disc drive 34 of the claimed invention as the frequency divider 46.

As is shown in FIG. 9, the value of the sum SUM equals 280 at a time t14. As aforementioned, when the sum SUM is larger than 200, the phase of the wobble clock CLK lags the phase of the wobble signal WBL', and the duration corresponding to the phase difference between the wobble signal WBL' and the wobble clock CLK is larger than a half cycle of the reference clock CLK_REF. Therefore, in order to reduce the phase difference between the wobble signal WBL' and the wobble clock CLK, the decision logic circuit 58 decreases the phase adjusting value PHASEDLY to advance the phase of the wobble clock CLK, which means the following time for the wobble clock CLK to swap the logic level is advanced. For instance, the phase adjusting value PHASEDLY is 2 before the time t14. After the time t14, the phase adjusting value PHASEDLY is decreased to 1. The wobble clock CLKa having a phase adjusting value PHASEDLY of 2 and the wobble clock CLKc having a phase adjusting value PHASEDLY of 1 are both shown in FIG. 11. It is obvious that the phase of the wobble clock CLKc having a phase adjusting value PHASEDLY of 1 leads the wobble clock CLKa having a phase adjusting value PHASEDLY of 2 by a cycle of the reference clock CLK_REF.

On the contrary, when the sum SUM is less than –200 at the time t14, the phase of the wobble clock CLK leads the phase of the wobble signal WBL', and the duration corresponding to the phase difference between the wobble signal WBL' and the wobble clock CLK is larger than a half cycle of the reference clock CLK_REF. Therefore, in order to reduce the phase difference between the wobble signal WBL' and the wobble clock CLK, the decision logic circuit 58 increases the phase adjusting value PHASEDLY to delay the phase of the wobble clock CLK, which means the following time for the wobble clock CLK to swap the logic level is delayed. For instance, the phase adjusting value PHASEDLY is 2 before the time t14. After the time t14, the phase adjusting value PHASEDLY is increased to 3. The wobble clock CLKa having a phase adjusting value PHASEDLY of 2 and the wobble clock CLKb having a phase adjusting value PHASEDLY of 3 are both shown in FIG. 11. It is obvious that the phase of the wobble clock CLKb having a phase adjusting value PHASEDLY of 3 lags the wobble clock CLKa having a phase adjusting value PHASEDLY of 2 by a cycle of the reference clock CLK_REF.

To sum up, a decreasing of the phase adjusting value PHASEDLY will advance the phase of the wobble clock CLK, and an increasing of the phase adjusting value PHASEDLY will delay the phase of the wobble clock CLK. Therefore, if a corresponding duration of the phase difference between the wobble signal WBL' and the wobble clock CLK is larger than a half cycle of the reference clock CLK_REF, the phase adjusting circuit 50 will increase or decrease the phase adjusting value PHASEDLY and the frequency divider 46 will delay or advance the phase of the wobble clock CLK according to the changing of the phase adjusting value PHASEDLY so as to reduce the phase difference between the wobble signal WBL' and the wobble clock CLK.

According to the embodiment of the claimed invention, please refer to FIG. 7 in conjunction with FIG. 8, a protection signal PROC is generated by the ADIP decoder 44 and is forwarded to the phase-frequency detector 52 of the phase adjusting circuit 50. The protection signal PROC is utilized to stop the phase-frequency detector 52 from outputting the control signals UP and DOWN to the counter 54. The related operation of the protection signal PROC is detailed hereafter.

Figure 1:
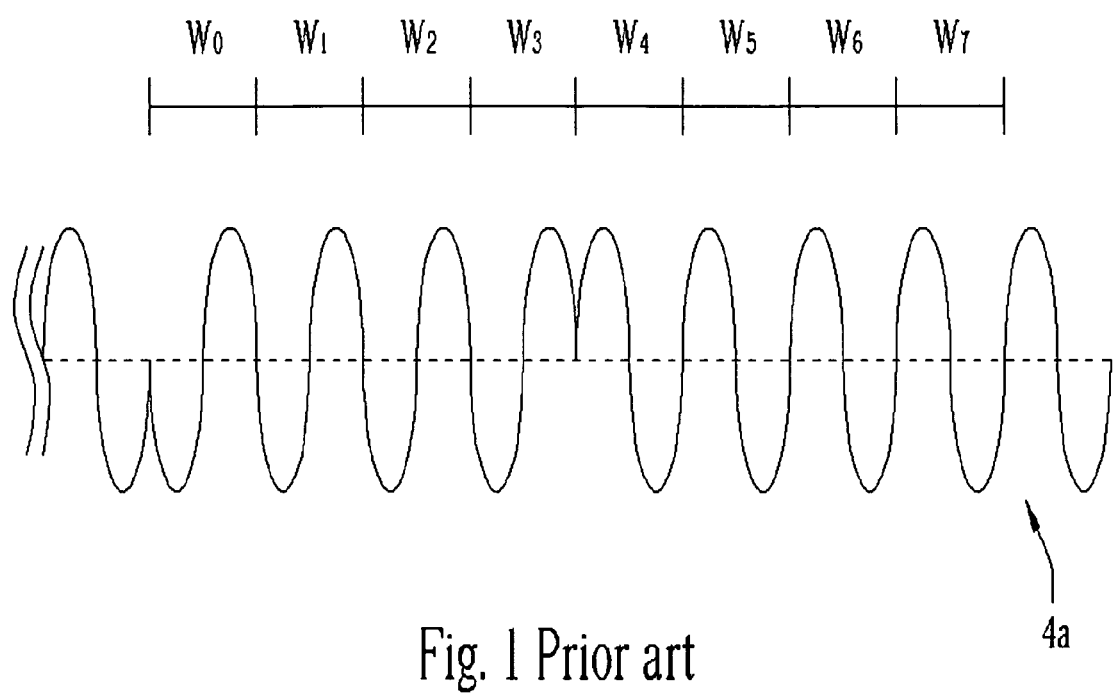
FIGS. 1-3 are diagrams of schematic waveforms of the prior art wobble signals.
Figure 2:
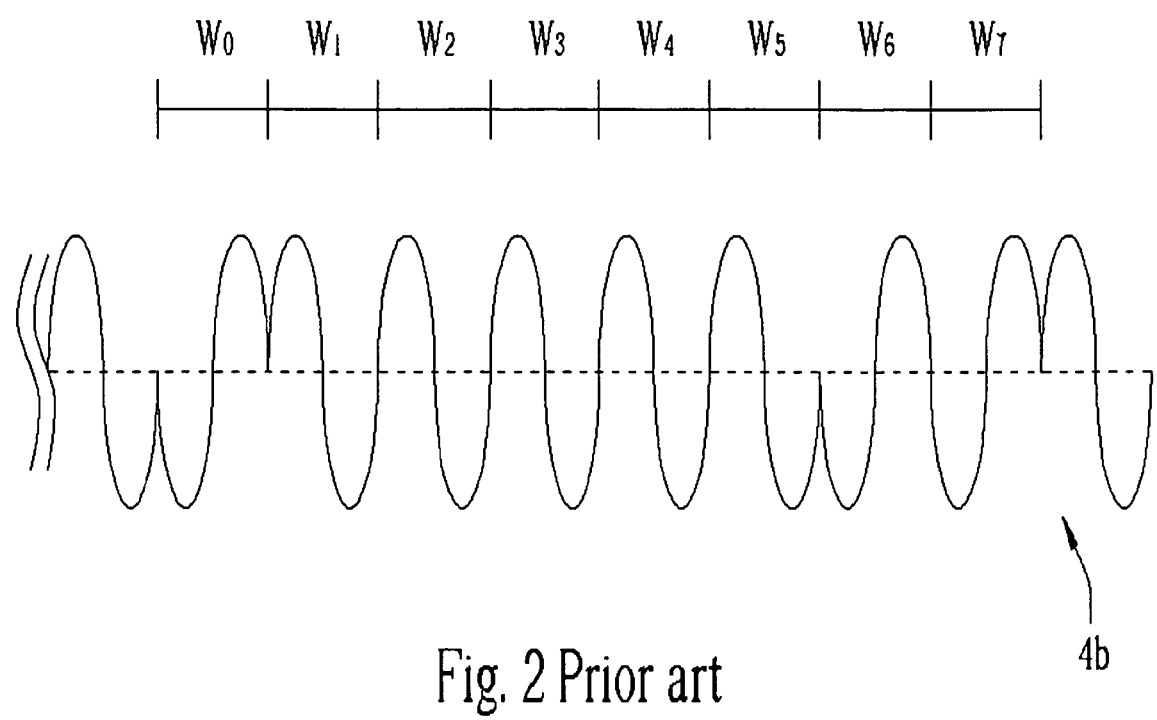
Figure 3:
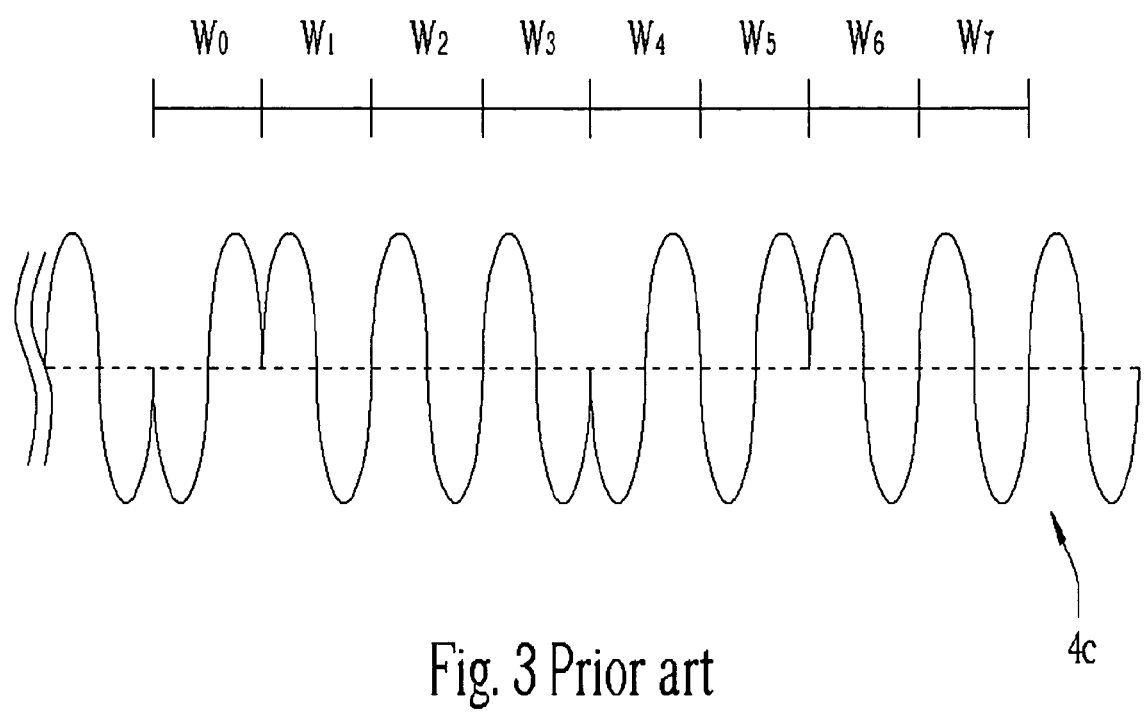
Figure 4:
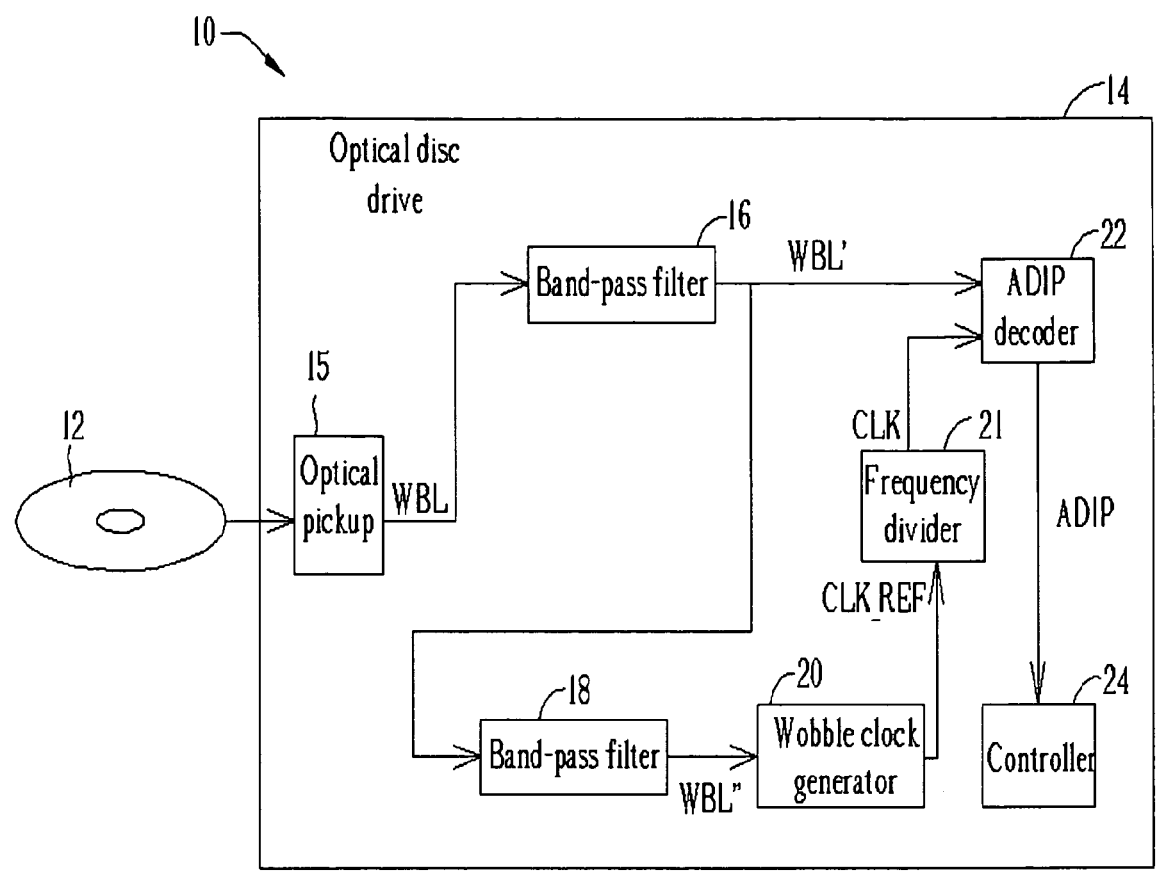
FIG. 4 shows a functional block diagram of a prior art optical disc drive system.
Figure 5:
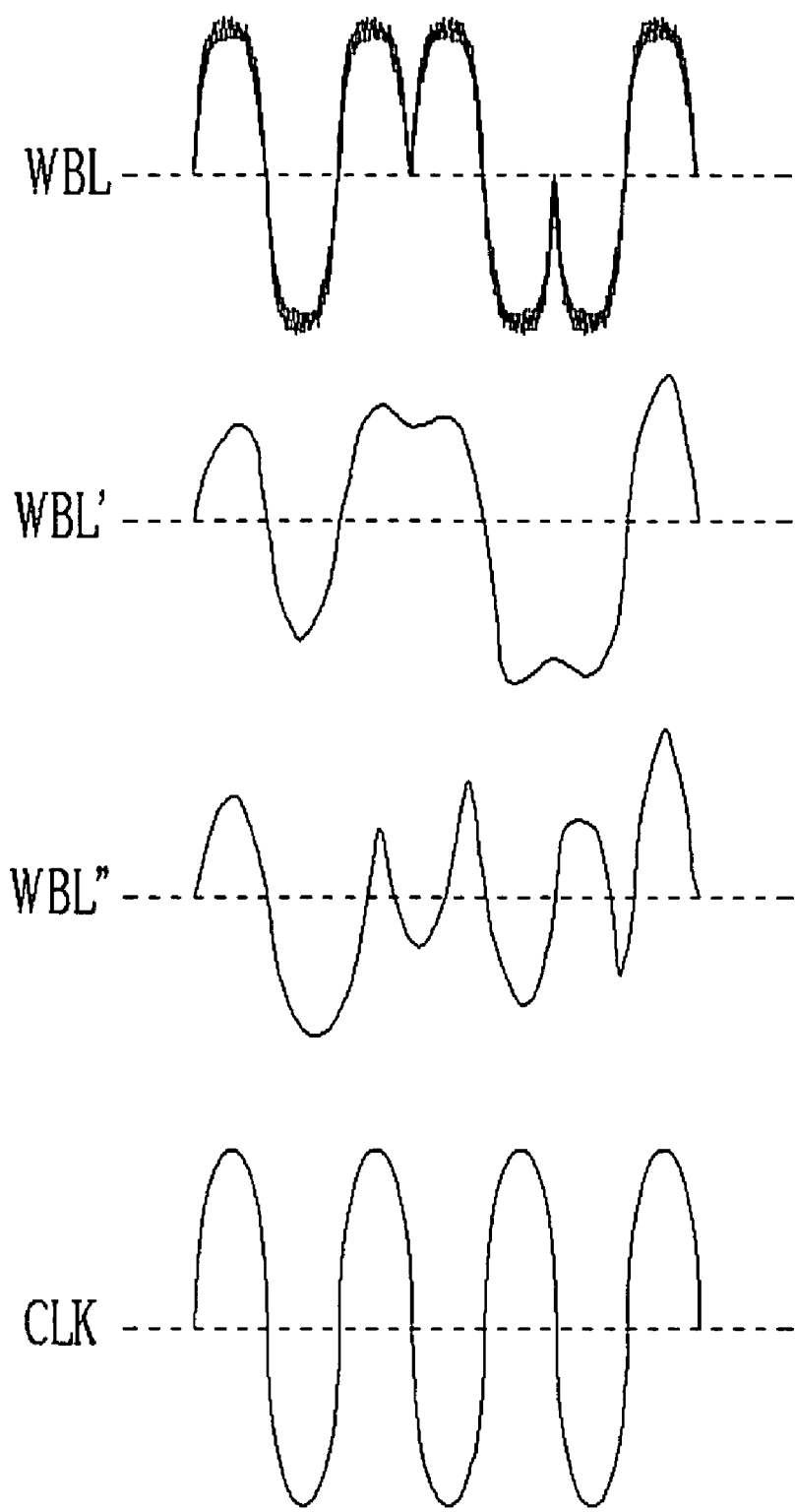
FIG. 5 is a diagram of schematic waveforms of the wobble signals WBL, WBL', and WBL", and the wobble clock CLK related to the optical disc drive system in FIG. 4.
Figure 6:
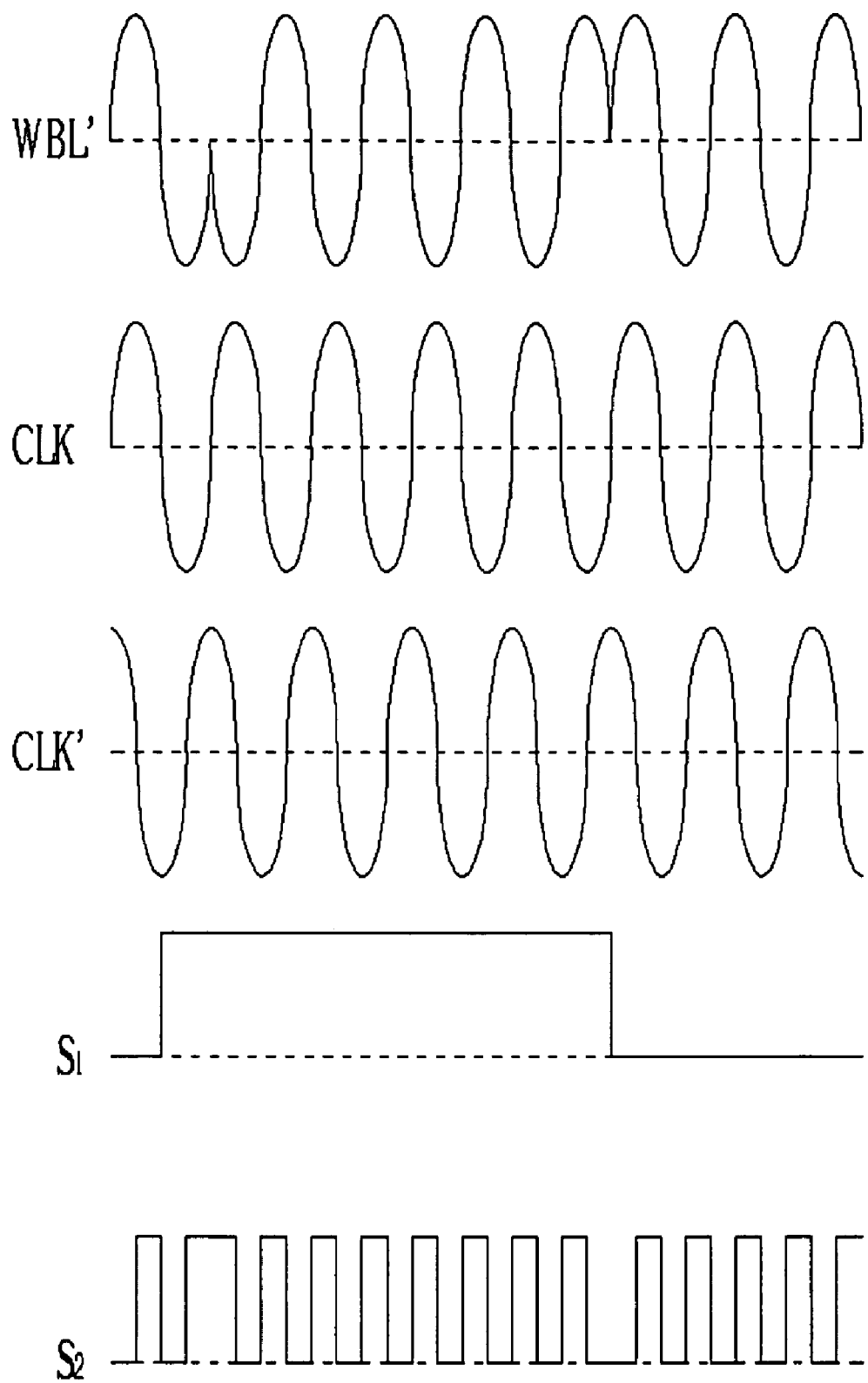
FIG. 6 is a diagram of schematic waveforms of the wobble signal WBL', the ideal wobble clock CLK, the real wobble clock CLK', the ideal processing signal S1, the real processing signal S2 related to the operation the ADIP decoder in FIG. 4.

Please refer to FIGS. 1-3. It is well known that the wobble signal WBL comprises a plurality of phase-modulated cycles. After a filtering process is performed by the first band-pass filter 38 on the plurality of phase-modulated cycles of the wobble signal WBL, the corresponding cycles of the wobble signal WBL' become unstable. Under such situation, if the phase-frequency detector 52 compares the unstable cycles of the wobble signal WBL' with the wobble clock CLK, error counting values of NUM1 and NUM2 are generated. The error counting values of NUM1 and NUM2 are forwarded to the decision logic circuit 58, and an error phase adjusting value PHASEDLY is then generated by the decision logic circuit 58, which causes a wrong phase adjusting procedure thereafter. The protection signal PROC is then introduced for the optical disc drive 30 to be capable of avoiding interference generated from any unstable cycle of the wobble signal WBL'.

According to the well-known specifications of the DVD+R optical drive and the DVD+RW optical drive, an ADIP unit corresponds to 93 wobble cycles and 8 wobble cycles of them are utilized to record an ADIP sync unit or an ADIP data unit by phase modulation. The other 85 wobble cycles are not phase modulated to record any information. The 85 non-phase-modulated wobble cycles enclosed in the phase-modulated wobble signal WBL' are then utilized to generate the non-phase-modulated wobble clock CLK. Thereafter, a decoding process performed by the ADIP decoder 44 based on an XOR operation is performed on the non-phase-modulated wobble clock CLK and the phase-modulated wobble signal WBL' to generate an ADIP. Therefore, an ADIP can be generated from the corresponding 8 wobble cycles in an ADIP unit. According to the specifications of the DVD+R optical drive and the DVD+RW optical drive, the subsequent 85 wobble cycles of the wobble signal WBL' should be in phase with the wobble clock CLK. Since an ADIP is decoded with the aid of the wobble clock CLK, the timing for the input of the next first phase-modulated wobble cycle of the wobble signal WBL' can be predicted. Consequently, the timing for the 8 phase-modulated wobble cycles of the wobble signal WBL' to input to the ADIP decoder 44 is preceded by the timing for the phase-frequency detector 52 to stop outputting the control signals UP and DOWN by the protection signal PROC with a predetermined time interval. As the unstable cycles of the wobble signal WBL' pass away, the protection signal PROC is then reset by the ADIP decoder 44 and the phase-frequency detector 52 is able to output the control signals UP and DOWN again. As a result, with the aid of the protection signal PROC, the phase adjusting circuit 50 is capable of avoiding interference generated from unstable wobble cycles of the wobble signal WBL' and is able to output an accurate phase adjusting value PHASEDLY for the frequency divider 46 to reduce the phase difference between the wobble signal WBL' and the wobble clock CLK.

Compared to the prior art, the optical disc drive of the claimed invention utilizes a phase adjusting circuit to calculate the phase difference between a wobble signal and a wobble clock. Next, a phase adjusting value is generated based on the phase difference and is forwarded to a frequency divider. When the phase of the wobble signal leads the phase of the wobble clock, the phase adjusting circuit will decrease the phase adjusting value to advance the phase of the wobble clock to reduce the phase difference. When the phase of the wobble signal lags the phase of the wobble clock, the phase adjusting circuit will increase the phase adjusting value to delay the phase of the wobble clock to reduce the phase difference. In addition, the ADIP decoder of the claimed invention is able to predict the timing of the next first phase-modulated wobble cycle of the wobble signal and generates a protection signal PROC to stop the phase adjusting circuit from performing the phase adjusting process at a predetermined time before the input of the next first phase-modulated wobble cycle of the wobble signal, which means the optical disc drive of the claimed invention is capable of avoiding interference generated from the phase-modulated wobble cycles of the wobble signal and is able to generate an accurate phase adjusting value PHASEDLY for the frequency divider to reduce the phase difference between the wobble signal and the wobble clock. While the phase adjusting circuit is driving the phase of the wobble clock to be close to the phase of the wobble signal, the ADIP decoder is able to decode the accurate information of an ADIP unit based on the phase-modulated wobble signal with the aid of the wobble clock.

Those skilled in the art will readily observe that numerous modifications and alterations of the device may be made while retaining the teachings of the invention. Accordingly, the above disclosure should be construed as limited only by the metes and bounds of the appended claims.

What is claimed is:

1. A phase adjusting circuit for generating a phase adjusting value based on a phase difference of a target clock signal and an input signal, the phase adjusting circuit comprising:
    a phase-frequency detector configured to generate a first control signal and a second control signal by comparing a phase of the input signal with a phase of the target clock signal;
    a clock generator configured to generate a reference clock;
    a counter connected to the phase-frequency detector and the clock generator and configured to generate a first counting value by counting a number of cycles of the reference clock during a duration of the first control signal, and to generate a second counting value by counting the number of cycles of the reference clock during a duration of the second control signal; and
    a decision logic circuit connected to the counter and configured to:
        generate a third counting value based on the first counting value and the second counting value,
        calculate a sum of a plurality of the third counting values,
        if a number of the plurality of the third counting values is greater than a predetermined number of cycles, provide the phase adjusting value,
        wherein the phase adjusting value is set to zero if the sum is within a specified range, and is set based on the sum if the sum is outside the specified range.

2. The phase adjusting circuit of claim 1, wherein the first control signal is generated if the phase of the input signal leads the phase of the target clock signal.

3. The phase adjusting circuit of claim 1, wherein the second control signal is generated if the phase of the input signal lags the phase of the target clock signal.

4. The phase adjusting circuit of claim 1, wherein the frequency of the reference clock is N times the frequency of the target clock signal and the specified range ranges from a positive number of N/2 to a negative number having an absolute value of N/2.

5. The phase adjusting circuit of claim 1, wherein the first counting value is a positive value, the second counting value is a negative value, and the third counting value is a sum of the first counting value and the second counting value.

6. The phase adjusting circuit of claim 1, wherein the phase-frequency detector is further able to receive a protection signal to stop outputting the phase adjusting value for avoiding interference generated from an unstable input signal.

7. A clock signal adjusting circuit comprising:
    a phase adjusting circuit for generating a phase adjusting value based on an input signal and a target clock signal, the phase adjusting circuit comprising:
        a phase-frequency detector configured to generate a first control signal and a second control signal by comparing a phase of the input signal with a phase of the target clock signal;
        a clock generator configured to generate a second reference clock;
        a counter connected to the phase-frequency detector and the clock generator configured to generate a first counting value by counting a number of cycles of the second reference clock during a duration of the first control signal, and to generate a second counting value by counting the number of cycles of the second reference clock during the duration of the second control signal; and
        a decision logic circuit connected to the counter and configured to:
            generate a third counting value based on the first counting value and the second counting value,
            calculate a sum of a plurality of the third counting values,
            if a number of the plurality of the third counting values is greater than a predetermined number of cycles, provide the phase adjusting value,
            wherein the phase adjusting value is set to zero if the sum is within a specified range, and is set based on the sum if the sum is outside the specified range; and
    a frequency divider connected to the phase adjusting circuit for adjusting the target clock signal by dividing the frequency of a first reference clock based on the phase adjusting value.

8. The clock signal adjusting circuit of claim 7, wherein the first control signal is generated if the phase of the input signal leads the phase of the target clock signal.

9. The clock signal adjusting circuit of claim 7, wherein the second control signal is generated if the phase of the input signal lags the phase of the target clock signal.

10. The clock signal adjusting circuit of claim 7, wherein the frequency of the second reference clock is N times the frequency of the target clock signal and the specified range ranges from a positive number of N/2 to a negative number having an absolute value of N/2.

11. The clock signal adjusting circuit of claim 7, wherein the frequency divider comprises:
 a counter for counting a cycle number of cycles of the first reference clock and resetting the cycle number after a specified number of cycles of the first reference clock;
 a register for storing the phase adjusting value;
 a comparator connected to the counter and the register for generating an enable signal if the cycle number of the first reference clock is equal to the phase adjusting value;
 a pulse generator connected to the comparator for generating an impulse if receiving the enable signal;
 a flip-flop having a trigger input terminal connected to the pulse generator for outputting the target clock signal while receiving the impulse; and
 an inverter having an input terminal for receiving the target clock signal and inverting the target clock signal to feedback to an input of the flip-flop.

12. The clock signal adjusting circuit of claim 7 being applied to an optical disc drive, the input signal being a wobble signal of an optical disc, the target clock signal being a corresponding wobble clock generated by the optical disc drive based on the wobble signal.

13. A method for adjusting clock signal comprising:
 generating a first control signal and a second control signal at a phase-frequency detector by comparing a phase of an input signal with the phase of a target clock signal;
 generating a first counting value by counting a number of cycles of a second reference clock during a duration of the first control signal;
 generating a second counting value by counting the number of cycles of the second reference clock during a duration of the second control signal;
 generating a third counting value based on the first counting value and the second counting value;
 calculating a sum of a plurality of the third counting values;
 if a number of the plurality of the third counting values is greater than a predetermined number of cycles, setting a phase adjusting value, wherein the phase adjusting value is set to zero if the sum is within a specified range and the phase adjusting value is set based on the sum if the sum is outside the specified range; and
 adjusting the target clock signal by dividing the frequency of a first reference clock based on the phase adjusting value.

14. The method of claim 13, wherein the first control signal is generated if the phase of the input signal leads the phase of the target clock signal.

15. The method of claim 13, wherein the second control signal is generated if the phase of the input signal lags the phase of the target clock signal.

16. The methods of claim 14, wherein the frequency of the second reference clock is N times the frequency of the target clock signal and the specified range ranges from a positive number of N/2 to a negative number having an absolute value of N/2.

17. The method of claim 13 further comprising:
 counting a cycle number of cycles of the first reference clock and resetting the cycle number after each predetermined number of cycles of the first reference clock;
 generating an enable signal if the cycle number of the first reference clock is equal to the phase adjusting value;
 generating an impulse when receiving the enable signal;
 outputting the target clock signal while receiving the impulse; and
 inverting the target clock signal to feedback to an input.

18. The method of claim 13 being applied to an optical disc drive, the input signal being a wobble signal of an optical disc, the target clock signal being a corresponding wobble clock generated by the optical disc drive based on the wobble signal.

19. An apparatus for adjusting a clock signal comprising:
 means for generating a first control signal and a second control signal by comparing a phase of an input signal with a phase of a target clock signal;
 means for generating a first counting value by counting a number of cycles of a second reference clock during a duration of the first control signal;
 means for generating a second counting value by counting the number of cycles of the second reference clock during a duration of the second control signal;
 means for generating a third counting value based on the first counting value and the second counting value;
 means for calculating a sum of a plurality of the third counting values;
 means for setting a phase adjusting value if a number of the plurality of the third counting values is greater than a predetermined number of cycles, wherein the phase adjusted value is set to zero if the sum is within a specified range and the phase adjusting value is set based on the sum if the sum is outside the specified range; and
 means for adjusting the target clock signal by dividing the frequency of a first reference clock based on the phase adjusting value.

20. The apparatus of claim 19, wherein the first control signal is generated if the phase of the input signal leads the phase of the target clock signal.

21. The apparatus of claim 19, wherein the second control signal is generated if the phase of the input signal lags the phase of the target clock signal.

22. The apparatus of claim 19, wherein the frequency of the second reference clock is N times the frequency of the target clock signal and the specified range ranges from a positive number of N/2 to a negative number having an absolute value of N/2.

23. The apparatus of claim 19 further comprising:
 means for counting a cycle number of cycles of the first reference clock and resetting the cycle number after each N cycles of the first reference clock;
 means for generating an enable signal if the cycle number of the first reference clock is equal to the phase adjusting value;
 means for generating an impulse when receiving the enable signal;
 means for outputting the target clock signal while receiving the impulse; and
 means for inverting the target clock signal to feedback to an input.

24. The apparatus of claim 19 being applied to an optical disc drive, the input signal being a wobble signal of an optical disc, the target clock signal being a corresponding wobble clock generated by the optical disc drive based on the wobble signal.

* * * * *

UNITED STATES PATENT AND TRADEMARK OFFICE
CERTIFICATE OF CORRECTION

PATENT NO.        : 7,508,894 B2                           Page 1 of 1
APPLICATION NO. : 10/709022
DATED             : March 24, 2009
INVENTOR(S)       : Yuan-Kun Hsiao It is certified that error appears in the above-identified patent and that said Letters Patent is hereby corrected as shown below:

In column 14, line 49, in Claim 7, after "during" delete "the" and insert -- a --, therefor.

In column 15, line 38, in Claim 13, after "with" delete "the" and insert -- a --, therefor.

In column 15, line 63, in Claim 16, delete "methods" and insert -- method --, therefor.

In column 15, line 63, in Claim 16, delete "14," and insert -- 13, --, therefor.

In column 16, line 32, in Claim 19, delete "adjusted" and insert -- adjusting --, therefor.

Signed and Sealed this

Nineteenth Day of May, 2009

JOHN DOLL
*Acting Director of the United States Patent and Trademark Office*

UNITED STATES PATENT AND TRADEMARK OFFICE
CERTIFICATE OF CORRECTION

| | | |
|---|---|---|
| PATENT NO. | : 7,508,894 B2 | Page 1 of 1 |
| APPLICATION NO. | : 10/709022 | |
| DATED | : March 24, 2009 | |
| INVENTOR(S) | : Hsiao | |

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 1,152 days.

Signed and Sealed this

Twenty-second Day of March, 2011

David J. Kappos
*Director of the United States Patent and Trademark Office*